United States Patent [19]

Kobayashi et al.

[11] Patent Number: 5,346,576
[45] Date of Patent: Sep. 13, 1994

[54] METHOD OF MANUFACTURING IC CARD

[75] Inventors: Makoto Kobayashi, Sanda; Syojiro Kodai; Katsunori Ochi, both of Itami, all of Japan

[73] Assignee: Mitsubishi Denki Kabushiki Kaisha, Tokyo, Japan

[21] Appl. No.: 85,054

[22] Filed: Jul. 2, 1993

Related U.S. Application Data

[62] Division of Ser. No. 648,511, Jan. 30, 1991, Pat. No. 5,250,341.

[30] Foreign Application Priority Data

Mar. 26, 1990 [JP] Japan ................... 2-78295

[51] Int. Cl.5 ............... B32B 31/00; B29C 65/02
[52] U.S. Cl. .................. 156/293; 156/295; 264/272.17
[58] Field of Search ............ 428/137, 209, 915, 916; 283/77, 83, 107, 109; 235/488, 489; 156/108, 293, 295; 264/272.17

[56] References Cited

U.S. PATENT DOCUMENTS

| | | | |
|---|---|---|---|
| 3,512,286 | 5/1970 | Siegel | 40/2.2 |
| 4,245,035 | 1/1981 | Poshkus | 430/496 |
| 4,417,413 | 11/1983 | Hoppe et al. | 40/630 |
| 4,450,024 | 5/1984 | Haghiri-Tehrani | 156/108 |
| 4,617,216 | 10/1986 | Haghiri-Tehrani | 428/67 |
| 4,841,134 | 6/1989 | Hida et al. | 235/488 |
| 4,879,153 | 11/1989 | Ohashi et al. | 428/76 |
| 4,889,749 | 12/1989 | Ohashi et al. | 428/13 |
| 5,026,452 | 6/1991 | Kodai | 156/293 |
| 5,079,673 | 1/1992 | Kodai et al. | 361/400 |

FOREIGN PATENT DOCUMENTS

| | | |
|---|---|---|
| 0209791 | 1/1987 | European Pat. Off. . |
| 0212506 | 3/1987 | European Pat. Off. . |
| 0326822 | 8/1989 | European Pat. Off. . |
| 3151408 | 6/1983 | Fed. Rep. of Germany . |
| 1263089 | 10/1989 | Japan . |
| 1263090 | 10/1989 | Japan . |
| 2188298 | 7/1990 | Japan . |

*Primary Examiner*—Michael W. Ball
*Assistant Examiner*—Rick Crispino
*Attorney, Agent, or Firm*—Leydig, Voit & Mayer

[57] ABSTRACT

In an IC card and a manufacturing method therefor, an adhesive is applied between core layers in the vicinity of an opening in which an IC module is placed. The core sheet layers held between adhesive layers can easily be deformed when heat and pressure are applied. Therefore, a gap formed between the card substrate and the IC module is filled. Furthermore, the gap from the IC module is narrower at the corners of the IC module than conventionally shaped openings. As a result, gaps at the corners of the IC module after integral molding are prevented. Therefore, the gap between the IC module and the card substrate can be reliably filled during molding.

10 Claims, 8 Drawing Sheets

METHOD OF MANUFACTURING IC CARD

This application is a division of application Ser. No. 07/648,511, filed Jan. 30, 1991, now U.S. Pat. No. 5,250,341

BACKGROUND OF THE INVENTION

1. Field of the Invention

The present invention relates to the structure of an IC card and a manufacturing method therefor, the IC card being manufactured by integrally molding a multilayer structure and an IC module.

Hitherto, when an IC card of a type which is constituted by an IC module in an opening portion in a card substrate and a boundary portion adhered by an adhesive is manufactured, the adhesive is used only in the opening portion as described below.

Figure 9A:
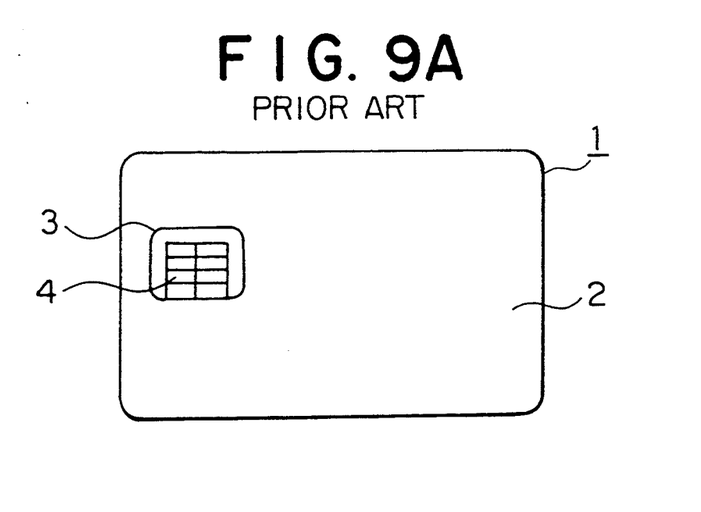
FIGS. 9A to 9C are respectively a plan view a side cross sectional view and an enlarged cross sectional view which illustrate a conventional IC card.
Figure 9B:
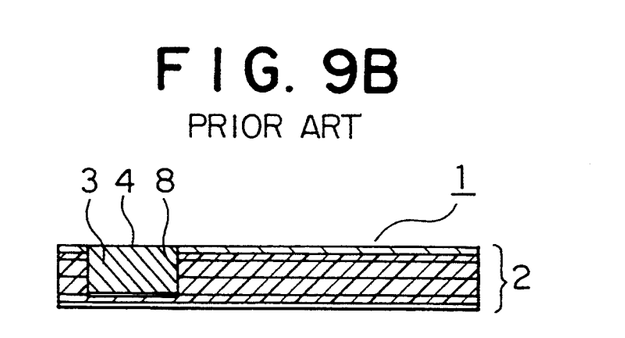
Figure 9C:
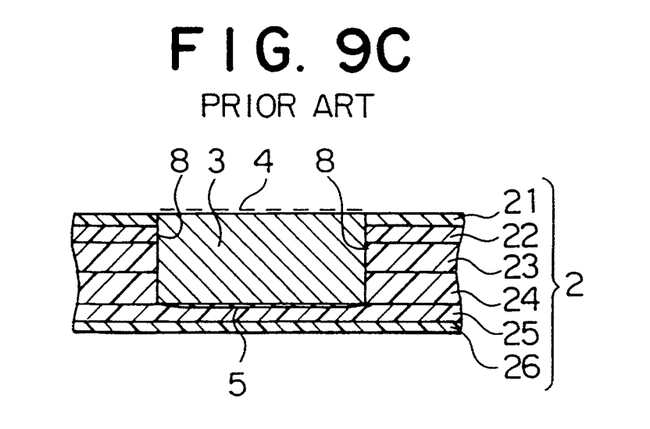

FIGS. 9A to 9C illustrate an IC card of the type described above. FIG. 9A is a plan view of the IC card, FIG. 9B is a side cross sectional view of the same and FIG. 9C is an enlarged cross sectional view which illustrates where a card substrate 2 of an IC card 1 and an IC module 3. Referring to the drawings, the card substrate 2 is multilayer sheet structure constituted by stacking overlays 21 and 26 as the outer layers which hold core sheets 22, 23, 24 and 25 therebetween. Each of the above-described sheets which form the multilayer structure has a through hole formed in a portion thereof an opening portion 8. Furthermore, an adhesive layer 5 is formed on the core sheet 25 which serves as the bottom portion of the opening portion 8, the adhesive layer 5 being disposed on the portion of the core sheet 25 which is in contact with the module 3.

Then, a process for manufacturing the IC card will be described. First, all of the sheets 21 to 26 are stacked up so that the opening portion 8 into which the IC module 3 is placed is formed. After the IC module 3 has been fitted within the above-described opening portion 8, the overall body is heated and pressure is applied while the body is; held by a mirror plate. That is, the card substrate of an existing credit card is, as regulated in JIS X6301, structured in such a manner that a multiplicity of hard vinyl chloride sheets are layered, the sheets in the form of a multilayer structure being then heated and pressed so as to be integrally molded; welded to one another.

Figure 10A:
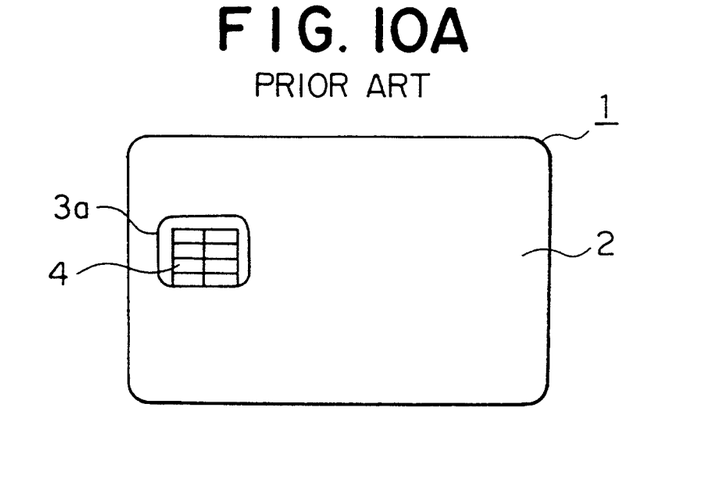
FIGS. 10A to 10C are respectively a plan view, a side cross sectional view and an enlarged cross sectional view which illustrate another conventional IC card.
Figure 10B:
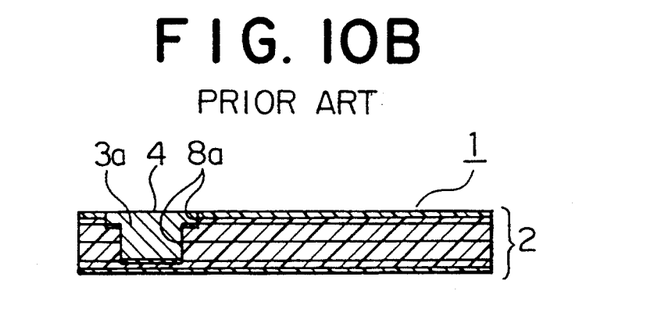
Figure 10C:
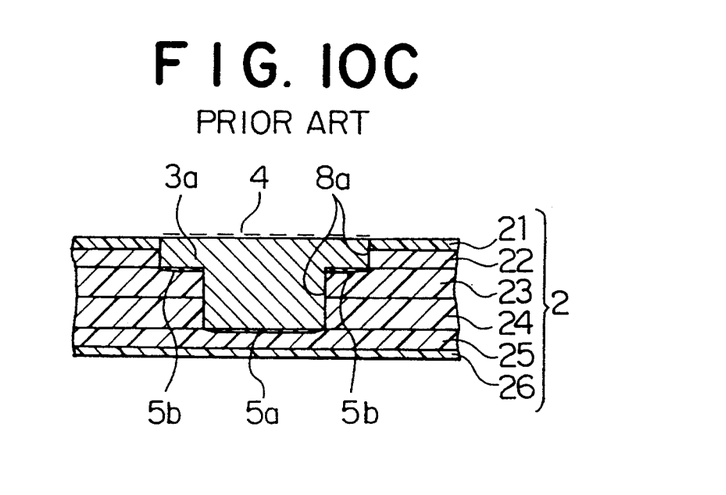

FIGS. 10A to 10C illustrate another IC card. An IC module 3a is arranged to have, in vertical cross section, a stepped portion. As shown in FIG. 10C which is an enlarged cross sectional view, an opening portion 8a into which the IC module 3a is fitted also has a two-step cross sectional shape and the adhesive layer is divided into two layers (5a and 5b). Other structures and the process for stacking the sheets and integrally molding the stacked structure are the same as those of the structure shown in FIGS. 9A to 9C.

The conventional IC cards of the type described above have been arranged in such a manner that the IC module is fitted within the opening portion formed through the sheets which constitute the card substrate. Therefore, the contour of the IC module and that of the opening portion must have precise dimensional accuracy. In particular, there arises a problem in that the IC module 3a having, as illustrated in FIGS. 10A to 10C, cannot easily be fitted into the opening portion 8a formed in the multilayer sheet while maintaining precise accuracy.

SUMMARY OF THE INVENTION

An object of the present invention is to overcome the above-described problems. Therefore, an object of the present invention is to provide an IC card and a manufacturing method therefor capable of, at the time of an integral molding with heat and pressure, perfectly plugging a gap generated due to variations in the dimension accuracy of an opening portion formed in a card substrate and that of the contour of an IC module which is coupled with the opening portion.

An IC card according to the present invention comprises: a card substrate having a multilayer sheet structure formed by stacking a plurality of sheets, the multilayer sheet structure having an opening which an IC module is mounted and an adhesive for adhering the IC module to the card substrate, the above-described card substrate, the multilayer sheet structure, the IC module and the adhesive being integrally molded with heat and pressure, wherein the adhesive is applied to a portion around the IC module between internal layers of a multilayer sheet constituting the card substrate in such a manner that two or more adhesive layers are at least partially overlapped so as to be integrally molded with heat and pressure.

According to the present invention, the adhesive placed between the internal layers of the multilayer sheet structure is melted at the time of the integral molding with heat and pressure. Therefore, the sheet material held between the adhesive layers can easily be deformed due to the action of the adhesive serving as a lubricant. As a result, a gap formed around the opening portion into which the IC module is mounted can be filled.

DESCRIPTION OF THE PREFERRED EMBODIMENTS

An embodiment of the present invention will now be described with reference to the drawings.

Figure 1A:
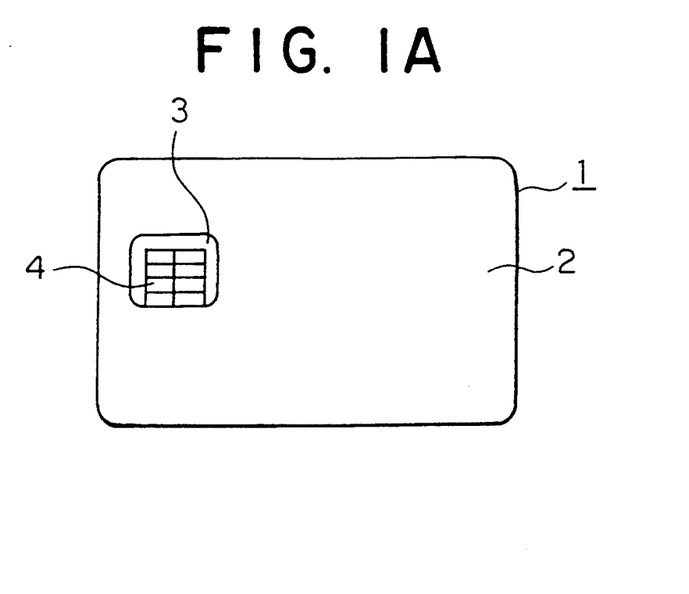
FIGS. 1A to 1C are respectively a plan view, a side cross sectional view and an enlarged cross sectional view which illustrate an embodiment of an IC card according to the present invention.
Figure 1B:
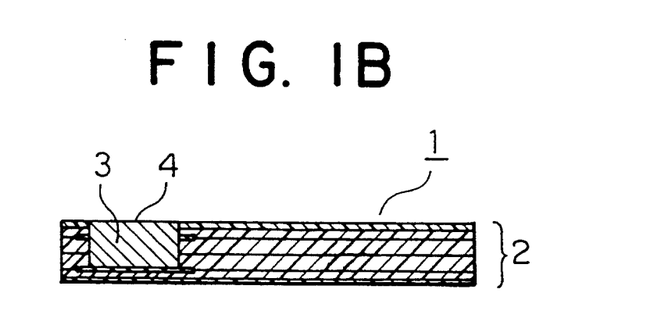
Figure 1C:
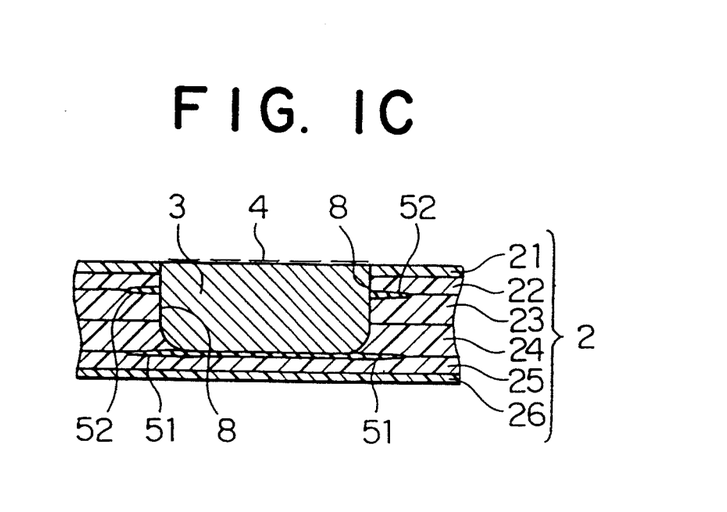
Figure 2A:
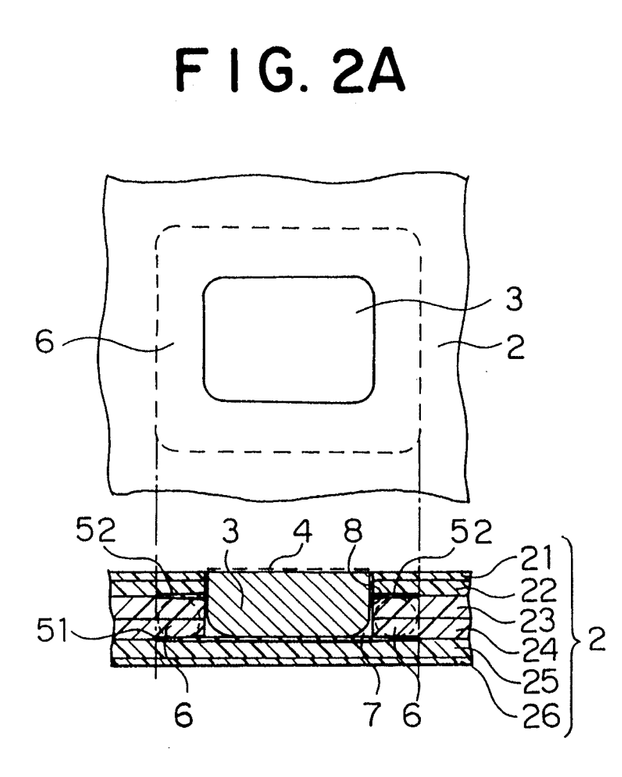
FIGS. 2A and 2B are partially enlarged views which respectively illustrate a state before integral-molding of the IC card shown in FIGS. 1A to 1C and a state after the IC card has been integrally molded.
Figure 2B:
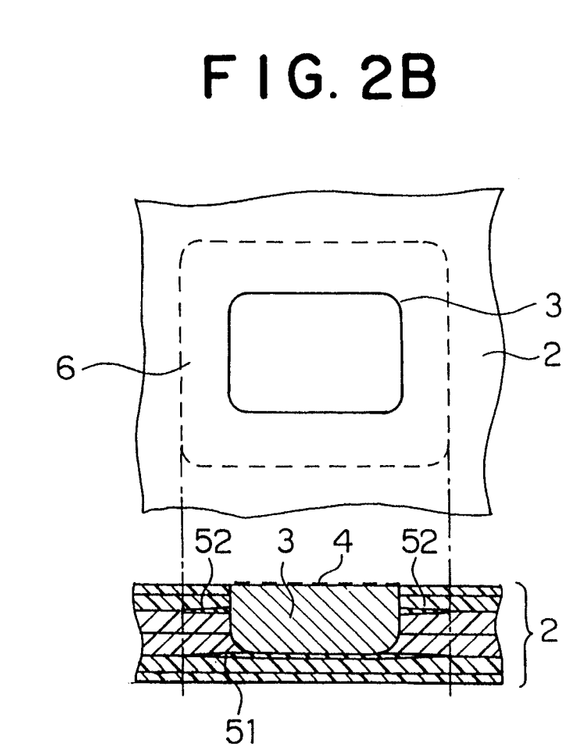

FIGS. 1A to 1C illustrate an IC card according to the present invention. FIG. 1A is a plan view which illustrates the IC card, FIG. 1B is a side cross sectional view which illustrates the same and FIG. 1C is an enlarged cross sectional view which illustrates a state where a card substrate 2 and an IC module 3 are combined. FIG. 2A is an enlarged view which illustrates a state before the card substrate 2 of the IC card 1 and the IC module 3 are integrally molded. FIG. 2B is an enlarged view which illustrates a state after they have been integrally molded.

Referring to the drawings, the card substrate 2 is, similarly to the conventional structure, in the form of a multilayer sheet structure arranged in such a manner that overlays 21 and 26 serving as the outer layers and core sheets 22, 23, 24 and 25 serving as the inner layers and held between the overlays 21 and 26 are stacked. Furthermore, an opening portion 8 into which the IC module 3 is fitted is formed in the above-described multilayer structured.

According to this embodiment, an adhesive is applied in such a manner that two layers of adhesive are respectively disposed between the core sheets 22 and 23 and between the core sheets 24 and 25, the adhesive being placed only around the opening portion 8. That is, as shown in FIG. 2A, an adhesive 52 is placed between the core sheets 22 and 23. Furthermore, an adhesive 51 is placed between the core sheets 24 and 25, including a portion which comes in contact with the bottom surface of the IC module 3. Furthermore, the adhesives 51 and 52 are applied so as to form layers around the opening portion 8 formed in the card substrate into which the IC module 3 is fitted. In this state, the IC module 3 is fitted into the opening portion 8 in such a manner that its external connection terminal 4 appears outside the surface of the IC card.

At this time, a gap 7 is formed between the opening portion 8 in the card substrate 2 and the IC module 3. In particular, since the opening portion 8 positioned in the card substrate is formed by overlapping the through holes formed in the core sheets, the shape of the opening portion 8 usually becomes a rectangular shape. Therefore, the gap 7 becomes too large as shown in FIG. 2A when the IC module, which has rounded corners along its bottom side which opposes the external connection terminal 4, is mounted.

After the sheets 21 to 26, the adhesives 51 and 52 and the IC module 3 have been coupled to one another, heat and pressure are applied to the coupled structure while holding the two sides of the structure (omitted from the illustration) so that a stacked structure is molded.

If the adhesive 5 (see FIG. 9C and 10C) is softened or melted at the time of molding the stacked structure, the gap cannot be filled satisfactorily since there is no passage through which the adhesive 5 may flow. In particular, a relatively large gap 7 as shown in FIG. 2A cannot be filled. As a result, the gap causes undesired wrinkles on the card surface, which critically damages the appearance of the IC card.

However, according to this embodiment, the adhesives 51 and 52 are applied so as to form the two overlapped layers. Therefore, a portion 6 around the opening portion 8 formed in the core sheets 23 and 24, which are held by the adhesives 51 and 52, of the card substrate is held with slide surfaces at the time of molding the stacked structure by heat and pressure. As a result, the portion 6 can move sideways very easily, causing the gap 7 to be filled, as shown in FIG. 2B, by the core sheets 23 and 24 which can slide.

Furthermore, as shown in the drawings in detail, since the adhesives 51 and 52 are simply held between the core sheets, the area that each of the portions to which the adhesives 51 and 52 have been respectively applied is enlarged by the amount of the adhesives 51 and 52 before the integral molding is performed. However, since the gap is filled by the core sheet after integral molding with heat and pressure, the surface can be flattened. The portion of the IC card to which no adhesive is applied does not, of course, slide sideways during molding of the stacked structure.

The sheets (made of, for example, vinyl chloride resin) of the card substrate are respectively melted at temperatures near their melting points at the time of molding the stacked structure (by heat and pressure). Therefore, for example, a heat sensitive adhesive having a melting point which is lower than that of the material (vinyl chloride) of the sheet is employed as the adhesives 51 and 52. As an alternative, a pressure sensitive adhesive or a B-stage heat sensitive type adhesive may be employed.

An essential portion of this embodiment lies in that two adhesive layers serving as lubricating layers at the time of molding the stacked structure to form the IC card are stacked so as to easily move and deform the core sheets disposed between the adhesive layers. As a result, the gap around the IC module can be eliminated.

Figure 3A:
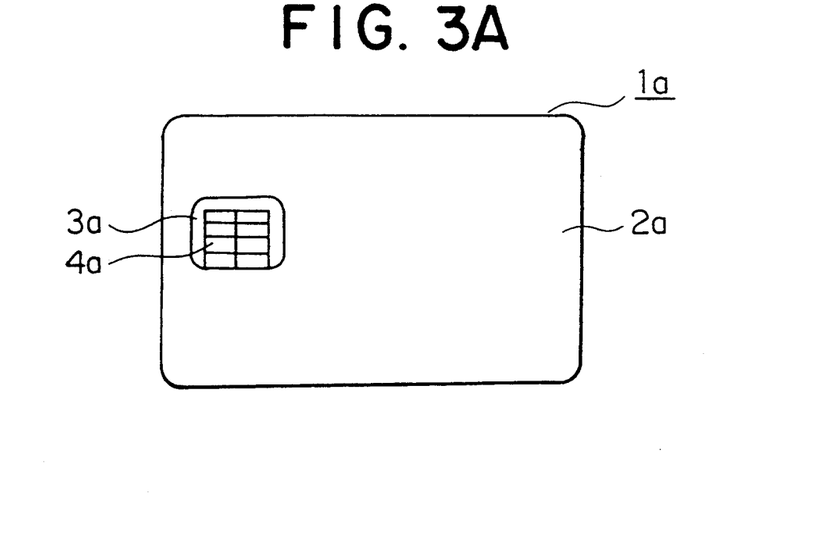
FIGS. 3A to 3C are respectively a plan view, a side cross sectional view and an enlarged cross sectional view which illustrate another embodiment of an -C card according to the present invention.
Figure 3B:
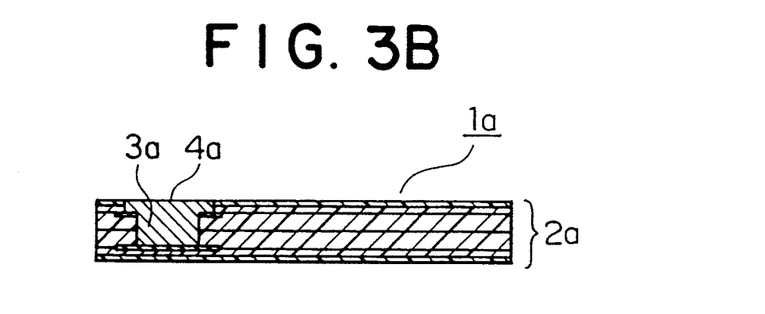
Figure 3C:
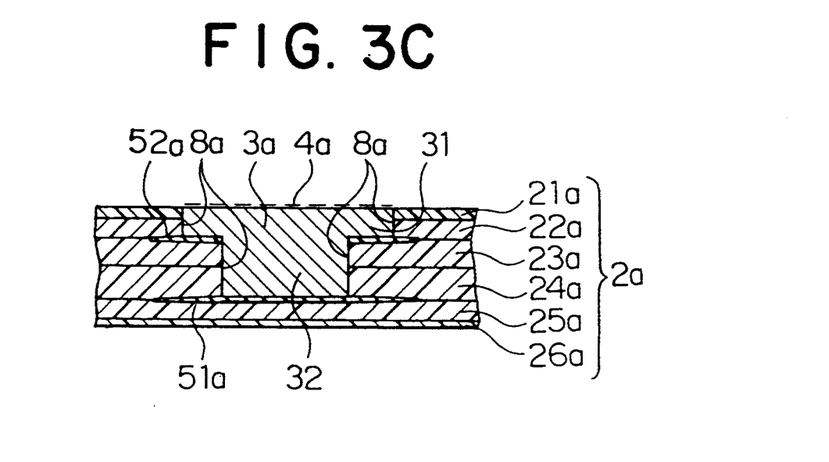
Figure 4A:
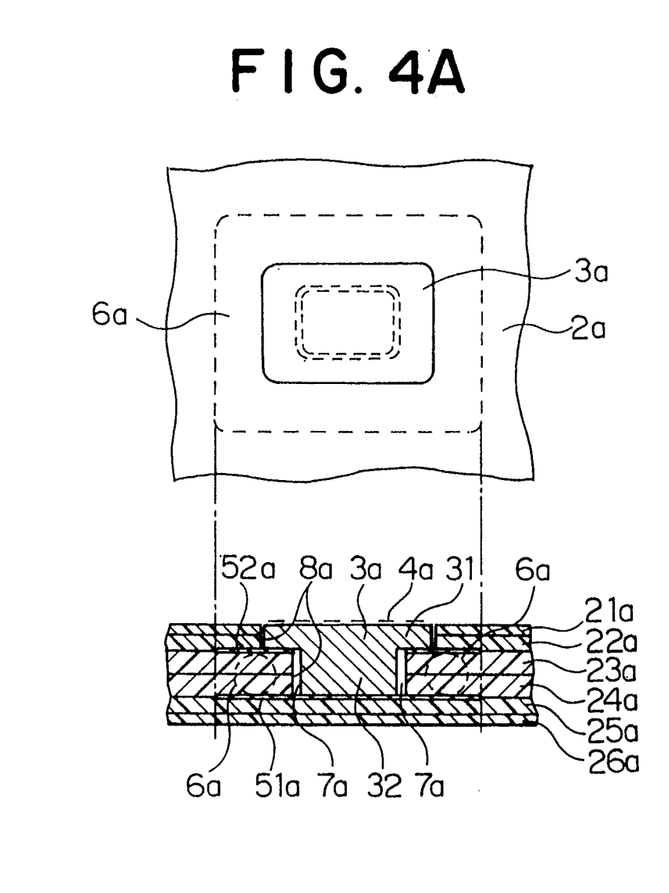
FIGS. 4A and 4B are partially enlarged views which respectively illustrate a state before integral-molding of the IC card shown in FIGS. 3A to 3C and a state after the IC card has been integrally molded.
Figure 4B:
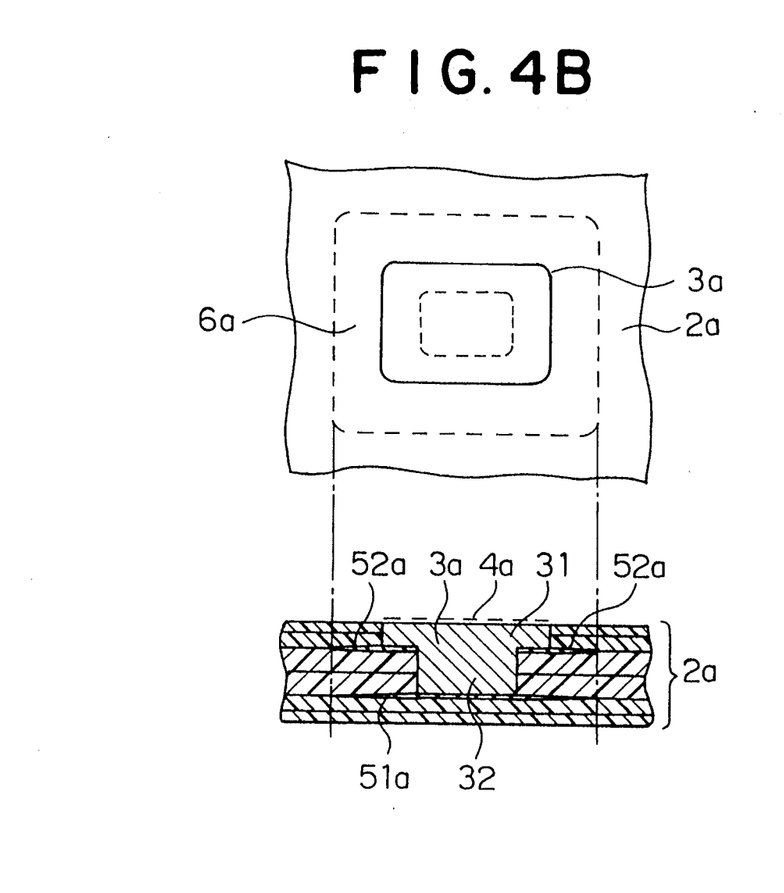

FIGS. 3A, 3C, 4A and 4B illustrate another embodiment of the IC card according to the present invention. FIG. 3A is a plan view which illustrates the IC card, FIG. 3B is a side cross sectional view which illustrates the same and FIG. 3C is an enlarged cross sectional view which illustrates a state where a card substrate 2a of an IC card 1a and an IC module 3a are coupled to each other. FIG. 4A is an enlarged view which illustrates a state before the card substrate 2a of the IC card 1a and the IC module 3a are coupled to each other. FIG. 4B is an enlarged view which illustrates a state after they have been coupled to each other.

According to this embodiment, the vertical cross sectional shape of the IC module 3a is not a rectangle but is a two-stepped shape arranged in such a manner that the side on which the external connection terminal 4a is present has a larger area on the surface of the card than within the card. When the IC card is warped, stress is concentrated in a portion of the card substrate with which the lower corner of the IC module comes in contact. Therefore, the above-described portion can easily be broken. Accordingly, the shape of the IC module 3a according to this embodiment is arranged as illustrated so that the number of the corners of the IC module 3a is increased so as to disperse the stress applied when the IC card is warped. In the following description, the portion of the IC module 3a having a large horizontal area is called a "terminal mount portion 31" and a portion of the same having a small area is called a "body portion 32".

In this case, an opening portion 8a formed in a card substrate 2a is formed by stacking sheets respectively having through holes the size of which are different from one another. Therefore, an error may occur in the stacked sheets. Furthermore, the IC module 3a, when it is manufactured, may vary in its shape between the terminal mount portion 31 and the central axis (the vertical axis) of the body portion 32. The external connection terminal 4a a must be positioned at a desired position on the card substrate 2a so as to establish a satisfactory connection with the card reader of the IC card. Therefore, the distance between the terminal mount portion 31 of the IC module 3a and an overlay 21a and that between the IC module 3a and a core sheet 22a must be greatly reduced. Therefore, both the above-described dimensional deflections are absorbed by the body portion 32 of the IC module 3a. That is, the through holes respectively formed in the core sheets 23a and 24a have a large size, whereby a large gap 7a is formed.

When the stacked structure is integrally molded with heat and pressure, surrounding the portion 6a of the intermediate layer of the IC module 3a held between the adhesive layers 51a and 52a slides inwards due to the lubricating action of the adhesive layer 52a between the core sheets 22a and 23a and the adhesive layer 51a between the core sheets 24a and 25a. As a result, the above-described gap 7a can effectively be filled.

Figures 5A, 5B:
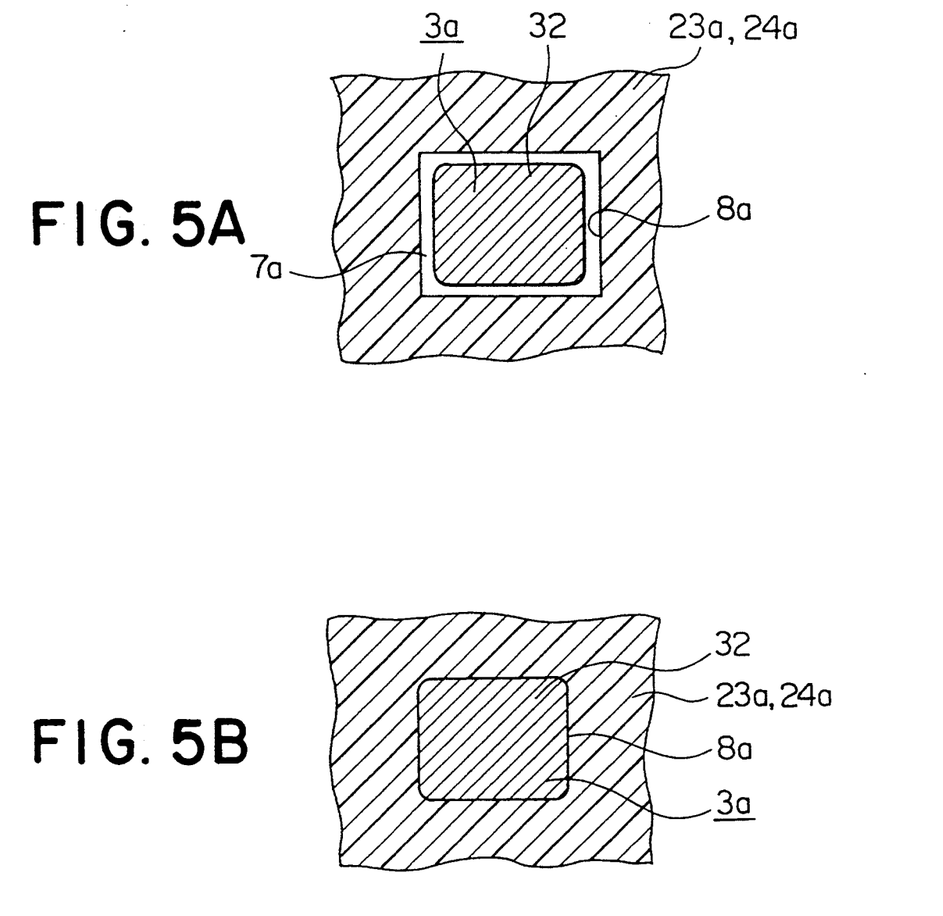
FIGS. 5A, 5B and 6 are plan cross sectional views which illustrate a state where a gap between an IC module and an opening portion is filled.

FIG. 5A is a plan cross sectional view which illustrates a portion of the core sheets 23a and 24a held between the adhesive layers 51a and 52a according to the second embodiment shown in FIGS. 3A to 4B, i.e. the portion surrounding the IC module 3a. As described above, the through hole formed by the core sheets 23a and 24a held between the adhesive layers 51a and 52a is large enough to absorb the dimensional tolerance of the opening portion 8a and the IC module 3a. The gap 7a exists around the IC module 3a before the integral molding. In the case shown in FIG. 5A, the through hole 8a formed by the core sheets 23a and 24a is substantially similar to the body 32 of the IC module 3a. Furthermore, the width of the gap 7a is substantially constant around the IC module 3a. After the integral molding has been completed with heat and pressure, the gap 7a is filled due to the deformation of each of the core sheets 23a and 24a. Identically, the gap 7a may be completely filled by the core sheet material as shown in FIG. 5B.

Figure 6:
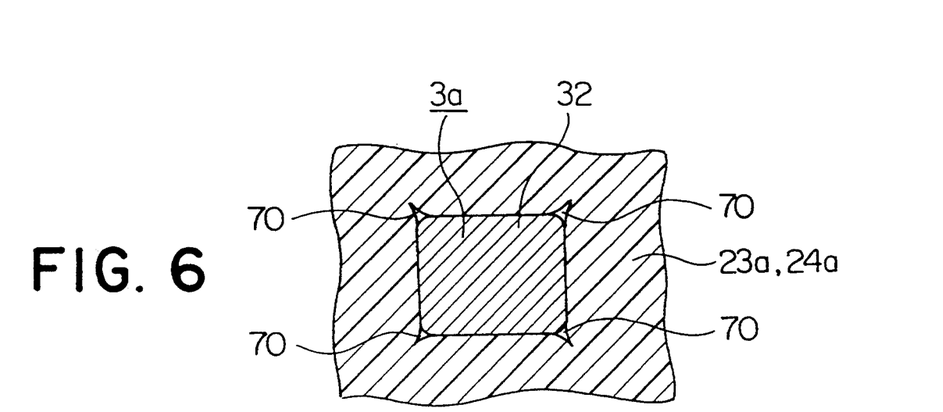

However portions 70 which are not filled with the core sheet material will, as shown in FIG. 6, be formed at positions which correspond to the four corners of the IC module 3a. The above-described undesirable portions 70 will be formed in a case where a deformation of the core sheets 23a and 24a around the IC module 3a takes place parallel to the gap 7a and the deformation at the central portion of each of the four sides, which is the straight portion, takes place faster than the deformation of the four corners. If the portions 70 which are not filled with the core sheet material are formed, undesirable recessed portions or pits may be formed along the surface of the IC card.

Figure 7:
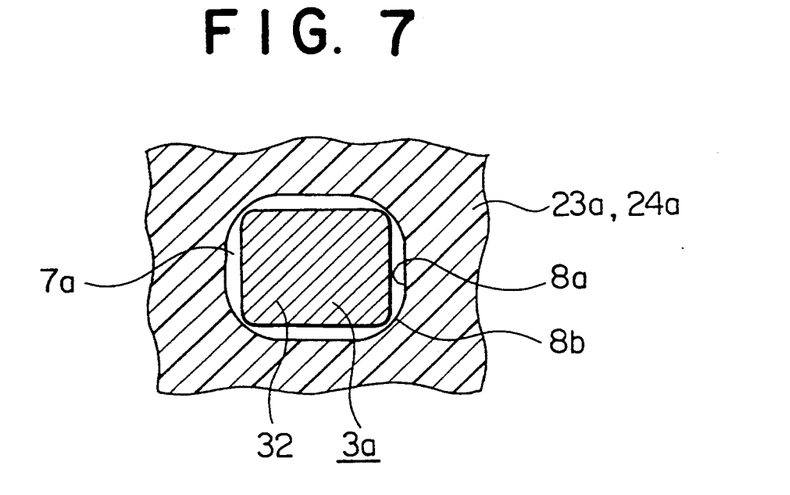
FIG. 7 is a plan-cross sectional view which illustrates the shape of a through hole formed in a core sheet of the IC card according to the present invention.

Accordingly, another embodiment of the present invention is, as shown in FIG. 7, arranged in such a manner that the through hole 8a formed in the core sheets 23a and 24a is in the form of a shape having four corner portions 8b which respectively have a radius of curvature which is larger than that of the corner of the body portion 32 of the IC module 3a. As a result, if the speed of deformation of the straight portion of the through hole 8a is too fast, the gap 70 (see FIG. 6) can be completely eliminated from each of the corner portions 8b. The elimination of the undesirable gap is a critical factor in improving the appearance of the IC card. If a slight portion which is not filled with the core sheet material exists, undesirable pits are formed in the surface of the IC card, causing the quality of the appearance of the IC card to b deteriorated. Furthermore, even if the dimension of the body portion 32 of the IC module 3a and that of the through hole 8a vary, the above-described two elements are in point-contact. Therefore, the IC module 3a can smoothly be fitted within the opening portion.

Figure 8:
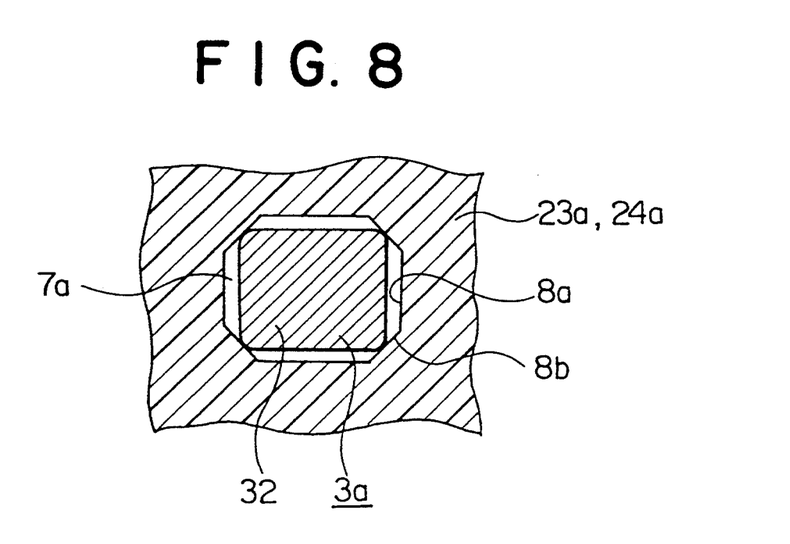
FIG. 8 is a horizontal cross sectional view which illustrates he shape of a through hole formed in a core sheet of the IC card according to another embodiment of the present invention.

The through hole 8a formed in the core sheets 23a and 24a may be in the form of a shape formed by cutting the corner portion 8b diagonally as shown in FIG. 8. The shape of he through hole formed in the core sheets 23a and 24a is not limited to the shapes respectively shown in FIGS. 7 and 8. Any shape can be employed if it is arranged in such a manner that the width of the gap 7a is reduced in the corner portion or the corner portion is able to contact the corner portion of the IC module in a point-contact.

According to each of the above-described embodiments, two layers composed of the core sheets 23 and 24 (23a and 24a ) are placed between the adhesive layers 51a and 52a. However, a similar effect can be obtained from a structure in which one ore sheet is o! aced between the adhesive layers or a structure in which three or more core sheets are stacked.

Another structure may be employed which is arranged in such a manner that three or more adhesive layers are stacked by additionally providing an adhesive layer between the core sheets 23 and 24 (23a and 24a).

As described above, the IC card according to the present invention is arranged in such a manner that the adhesive is applied to form two or more layers which overlap one another around the opening portion into which the IC module is embedded, the adhesive being placed on the inner surface of the card substrate having the multilayer sheet structure. Therefore, the core sheet layer held between the adhesive layers can easily be deformed at the time of integral molding with heat and pressure. As a result, the gap between the card substrate and the IC module can be perfectly filled. Furthermore, the above-described opening portion formed in the core sheets held between the adhesive layers is arranged in such a manner that the gap with the IC module is reduced in the corners of the opening in comparison to the gap along the straight sides of the module. As an alternative to this, the opening portion is arranged to come in contact with the corner portion of the IC module at a point-contact. Therefore, the gap can be eliminated from the corner portion of the IC module after the integral molding has been performed. As a result, the gap around the IC module can be perfectly and assuredly filled.

What is claimed is:

1. A method of manufacturing an IC card comprising:
    forming through holes in a plurality of core sheets;
    providing a core sheet without a hole;
    stacking the core sheets with through holes in sequence on the core sheet without a hole to form an opening defined by the through holes, and the core sheet without a hole, including placing at least one adhesive layer between and contacting at least two adjacent core sheets at the periphery of the through holes leaving adhesive-free areas between the core sheets remote from the opening;
    placing an IC module into the opening, a gap being formed between the opening and the IC module; and applying heat and pressure to the core sheets, at least one adhesive layer, and IC module, wherein the gap between said IC module and said core sheets is filled while applying heat and pressure.

2. The method of manufacturing an IC card according to claim 1 wherein said IC module includes a first portion having a rectangular cross section generally parallel to the plurality of core sheets and a first surface on which an external connection terminal is disposed and a second portion having a rectangular cross section generally parallel to the plurality of core sheets with a smaller area than the first portion comprising stacking the core sheets with the through holes to form an opening having a shape conforming to the first and second portions of the IC module.

3. The method of manufacturing an IC card according to claim 2 including, before placing the IC module in the opening, placing an adhesive layer in the opening on the core sheet without a through hole and extending beyond the opening between the core sheet without a through hole and an adjacent core sheet with a through hole and placing the IC module in the opening so that the adhesive layer in the opening contacts a second surface of the IC module opposite the first surface of the IC module.

4. The method of manufacturing an IC card according to claim 2 wherein the rectangular cross sections include corners and the opening has a shape forming the gap with the IC module before applying heat and pressure so that the gap is smaller adjacent corners of the IC module than remote from the corners of the IC module.

5. The method of manufacturing an IC card according to claim 2 wherein the cross section of the second portion includes rounded corners and the through holes include rounded corners forming part of the opening and having a radius of curvature larger than a radius of curvature of the rounded corners of the cross section of the second portion of the IC module.

6. The method of manufacturing an IC card according to claim 2 wherein the rectangular cross sections have corners and the opening has a shape including planar surfaces at each of the corners of the opening adjacent and diagonal to the corners of the IC module.

7. The method of manufacturing an IC card according to claim 1 including integrally molding a protection sheet layer as an outer on said plurality of core sheets.

8. The method of manufacturing an IC card according to claim 1 wherein adhesive layer is a heat sensitive adhesive having a melting point lower than that of the core sheets.

9. The method of manufacturing an IC card according to claim 1 wherein the adhesive layer is a pressure sensitive adhesive.

10. The method of manufacturing an IC card according to claim 1 wherein the adhesive layer is a B-stage heat hardening adhesive.

* * * * *